(12) United States Patent
Wada (10) Patent No.: US 9,934,994 B2
(45) Date of Patent: Apr. 3, 2018

(54) LINEARLY MOVING AND ROTATING DEVICE SWITCHABLE BETWEEN LINEARLY MOVING AND ROTATING

(71) Applicant: Daifuku Co., Ltd., Osaka-shi (JP)

(72) Inventor: Yoshinari Wada, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/037,785

(22) PCT Filed: Oct. 31, 2014

(86) PCT No.: PCT/JP2014/079038
§ 371 (c)(1),
(2) Date: May 19, 2016

(87) PCT Pub. No.: WO2015/076086
PCT Pub. Date: May 28, 2015

(65) Prior Publication Data
US 2016/0293464 A1 Oct. 6, 2016

(30) Foreign Application Priority Data

Nov. 20, 2013 (JP) ................................. 2013-240243

(51) Int. Cl.
*H01L 21/677* (2006.01)
*B65G 47/90* (2006.01)

(52) U.S. Cl.
CPC ...... *H01L 21/67733* (2013.01); *B65G 47/902* (2013.01); *B65G 47/905* (2013.01); *H01L 21/6773* (2013.01); *H01L 21/67706* (2013.01); *B65G 2201/0297* (2013.01)

(58) Field of Classification Search
CPC ................................................ H01L 21/67733
See application file for complete search history.

(56) References Cited

U.S. PATENT DOCUMENTS 1,554,746 A * 9/1925 Meinel ..................... B23K 5/24
211/105
7,887,108 B1 * 2/2011 Cawley ................. B25J 15/022
414/731

FOREIGN PATENT DOCUMENTS

JP 62-47581 A * 3/1987
JP 2000161457 A 6/2000
(Continued)

*Primary Examiner* — Gerald McClain
(74) *Attorney, Agent, or Firm* — The Webb Law Firm (57) ABSTRACT

The linearly moving and rotating device includes a support portion that supports an operated member integrally provided with the article support portion, for rotation about the movable axis and for movement along the first direction, and a linearly movable member which is moved along the first direction by the actuator. The operated member is connected to the linearly movable member in a portion spaced apart from the movable axis as seen along a direction along the movable axis. The linearly moving and rotating device includes an operating state switching portion which can be switched to a linearly moving state for restricting rotation of the operated member about the movable axis and for allowing movement of the operated member along the first direction, and to a rotating state for allowing rotation of the operated member about the movable axis and for restricting movement of the operated member along the first direction.

3 Claims, 7 Drawing Sheets

(56) References Cited

FOREIGN PATENT DOCUMENTS

JP  2003316440 A  *  11/2003
JP  2005225598 A  *   8/2005

* cited by examiner

LINEARLY MOVING AND ROTATING DEVICE SWITCHABLE BETWEEN LINEARLY MOVING AND ROTATING

CROSS-REFERENCE TO RELATED APPLICATIONS

This application is the United States national phase of International Application No. PCT/JP2014/079038 filed Oct. 31, 2014, and claims priority to Japanese Patent Application No. 2013-240243 filed Nov. 20, 2013, the disclosures of which are hereby incorporated in their entirety by reference.

The present invention relates to a linearly moving and rotating device for moving an article support portion for supporting an article along a straight first direction and for rotating the article support portion about a movable axis extending perpendicular to the first direction.

DESCRIPTION OF RELATED ART

Linearly moving and rotating devices are provided, for example, in ceiling transport vehicles for transporting articles in a factory. The ceiling transport vehicle is configured such that its travel portion travels along travel rails suspended from the ceiling. An article support portion is supported by the travel portion. The article support portion includes a grip portion for griping or holding an article, and a vertical movement actuator for vertically moving the grip portion. The ceiling transport vehicle transfers an article being transported to or from a transfer location for transferring an article, with the grip portion lowered. When this happens, the position and orientation, in plan view, of the article of the article support portion are adjusted by the linearly moving and rotating device. This allows the position and orientation, in plan view, of the article gripped by the grip portion to be appropriate for the transfer location so that the ceiling transport vehicle can properly transfer the article to or from the transfer location.

An example of a linearly moving and rotating device is disclosed in JP Publication of Application No. 2000-161457 (Patent Document 1). This linearly moving and rotating device has an article support portion which rotates integrally with a pinion gear which is rotatable about a movable axis extending along a vertical direction. The pinion gear is held between a pair of rack gears which face each other. Each of the pair of rack gears is attached to a block which is moved along a screw shaft by the rotation of the screw shaft. Each block meshes with the corresponding one of the screw shafts. Each of the pair of rack gears moves along a direction along the pivot axis of the screw shaft (this direction will be referred to as the "first direction") as the screw shaft rotates. Note that a pair of motors for drivingly rotating these screw shafts are provided to respective ones of the pair of screw shafts.

When using such a linearly moving and rotating device to move the article support portion along the first direction, rotations of the two motors are controlled to move the pair of rack gears in the same direction by the same amount of movement that corresponds to the amount of movement of the article support portion. On the other hand, when rotating the article support portion about the movable axis extending along the vertical direction, the rotations of the two motors are controlled to cause the amount of movement of each rack gear to be different from that of the other rack gear. In other words, the article support portion can be rotated in accordance with the difference between the movement amounts of the two rack gears.

PRIOR ART DOCUMENTS

Patent Document

Patent Document 1: JP Publication of Application No. 2000-161457

SUMMARY OF THE INVENTION

Problems to be Solved by the Invention

As described above, the linearly moving and rotating device of Patent Document 1 requires two actuators to produce movement of the article support portion along the first direction, and rotation of the article support portion about the movable axis extending along the vertical direction. However, when two actuators are provided to a linearly moving and rotating device, the size of the device may increase or the weight of the linearly moving and rotating device may increase. It is especially desirable to reduce such increase in size and weight of a linearly moving and rotating device in a ceiling transport vehicle in which loads need to be supported by the ceiling.

Thus, a linearly moving and rotating device is desired which can produce both of movement of an article support portion along a first direction (linear movement) and rotation of the article support portion about a movable axis extending perpendicular to the first direction and in which any increase in its size and weight can be reduced.

Means for Solving the Problems

The characteristic arrangement of the linearly moving and rotating device in accordance with the present invention is that the linearly moving and rotating device for moving an article support portion for supporting an article along a straight first direction and for rotating the article support portion about a movable axis extending perpendicular to the first direction, comprises:

an operated member which is integrally provided with the article support portion;

a support portion that supports the operated member for rotation about the movable axis and that supports the operated member for movement along the first direction; and a linearly movable member which is moved along the first direction by an actuator;

wherein the operated member is connected to the linearly movable member in a portion spaced apart from the movable axis as seen along a direction along the movable axis, and an operating state switching portion which can be switched to a linearly moving state for restricting rotation of the operated member about the movable axis and for allowing movement of the operated member along the first direction, and to a rotating state for allowing rotation of the operated member about the movable axis and for restricting movement of the operated member along the first direction.

With this arrangement, the operated member can be moved along the first direction by causing the linearly movable to move along the first direction in the linearly moving state (the state for restricting rotation of the operated member about the movable axis and for allowing movement of the operated member along the first direction) That is, the article support portion provided integrally with the operated member can be moved along the first direction (can be moved straight). In addition, the operated member can be rotated about the movable axis by causing the linearly movable member to be moved along the first direction in the rotating state (the state for allowing rotation of the operated member about the movable axis and for restricting movement of the operated member along the first direction). That is, the article support portion provided integrally with the operated member can be rotated about the movable axis.

Thus, by providing a single actuator for moving the linearly movable member along the first direction, both of movement of the article support portion along the first direction and rotation of the article support portion about the movable axis can be achieved. Thus, increase in the size and weight of the linearly moving and rotating device can be reduced. Thus, a linearly moving and rotating device is provided which can produce both of movement of an article support portion along a first direction and rotation of the article support portion about the vertically extending movable axis and in which any increase in its size and weight can be reduced.

Here, the actuator preferably includes a screw shaft arranged such that a pivot axis thereof extends along the first direction, and a rotation motor for drivingly rotating the screw shaft about the pivot axis, wherein the linearly movable member is preferably attached to the screw shaft so as to move along the first direction as the screw shaft is rotated. With this arrangement, since the linearly movable member is moved along the first direction by the screw shaft drivingly rotated by the rotation motor, the amount of movement of the linearly movable member along the first direction can be accurately adjusted. Therefore, when achieving the linear movement (movement of the article support portion along the first direction caused by the movement of the linearly movable member) and the rotating movement (rotation of the support portion about the vertically extending movable axis), the amount of movement of the article support portion along the first direction, and the amount of rotation of the article support portion about the movable axis can be accurately adjusted.

In addition, the linearly moving and rotating device in accordance with the present invention includes, in one embodiment, a controller for controlling operations of the actuator and the operating state switching portion is preferably provided, wherein the controller preferably performs a linear movement actuation control for causing the article support portion to be moved along the first direction by placing the operating state switching portion in the linearly moving state and activating the actuator, and a rotation control for causing the article support portion to be rotated about the movable axis by placing the operating state switching portion in the rotating state and activating the actuator. That is, by controlling the switching state of the operating state switching portion and the operation of the actuator by the controller, the switching between the linear movement and rotating movement of the article support portion can be performed automatically; thus, a linearly moving and rotating device which is easy to use can be obtained.

MODES FOR CARRYING OUT THE INVENTION

Figure 1:
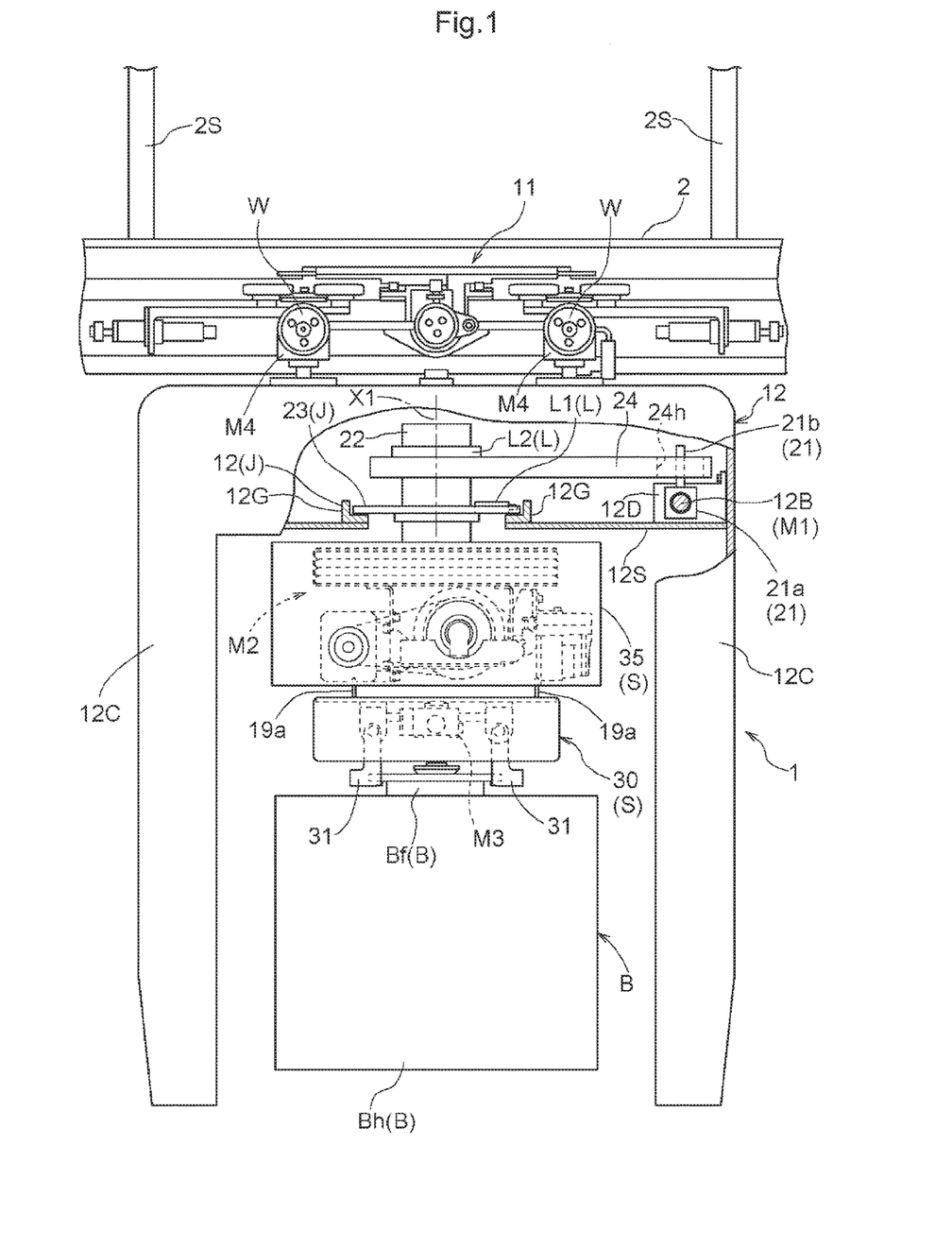
FIG. 1 is a partially cutaway side view of a ceiling transport vehicle in accordance with an embodiment.

Embodiments of the present invention are described next with reference to the drawings, using an example in which the linearly moving and rotating device of the present invention is applied to a ceiling transport vehicle. As shown in FIG. 1, the ceiling, or overhead, transport vehicle 1 includes a travel portion 11 which can travel on travel rails 2 suspended from rail support bodies 2S provided to the ceiling, and a main body portion 12 which is suspended from and supported by the travel portion 11. The travel portion 11 includes travel wheels W which roll on the travel rails 2, and travel actuators M4 which drivingly rotate the travel wheels W. The ceiling transport vehicle 1 is configured to transport a container B among the transfer locations (referred to, hereinafter, as stations) of a plurality of processing devices, treating the container B holding semiconductor substrates as an article to be transported. The processing devices are configured to perform predetermined operations on work-in-process parts, etc. during the manufacturing of semiconductor substrates.

The main body portion 12 includes cover portions 12C at a front and back positions along a travel direction of the travel portion 11, and is formed to have a C-shape that opens downwardly, as shown in FIG. 1. The main body portion 12 is divided into a portion above and a portion below by a horizontal support plate 12S. An article support portion S for supporting a container B is provided below the support plate 12S whereas a linearly moving and rotating device described below is provided above the support plate 12S. Note that the linearly moving and rotating device is used to move the article support portion S along a straight first direction D1 and to rotate the article support portion S about a movable axis ("X1" as described below) which extends perpendicular to the first direction D1 and extends along a vertical direction.

The article support portion S includes a grip portion 30 for gripping, or holding, a container B, and a vertical movement actuator 35 for vertically moving the grip portion 30. The grip portion 30 includes gripping oscillation members 31 which can be moved toward and away from each other by a grip portion actuator M3. The gripping oscillation members 31 engage a flange Bf attached to an upper end of a container main body Bh of the container B, as the gripping oscillation members 31 are moved closer to each other by actuating action of the grip portion actuator M3. In other words, the gripping oscillation members 31 grip, or hold, a container B with the gripping oscillation members 31 engaging the flange Bf. In addition, the gripping oscillation members 31 release the engaging action on the flange Bf as the gripping oscillation members 31 are moved farther apart from each other by the actuating action of the grip portion actuator M3.

Note that the actuating force from the grip portion actuator M3 is transmitted to the gripping oscillation members 31 using a known mechanism, such as a lead screw mechanism, or a crank mechanism, etc., for example, and thus, description of such mechanism is omitted. In addition, to allow the grip portion 30 to securely grip, or hold, the container B, the gripping oscillation members 31 and the flange Bf are configured to engage each other in a "set engaging positional relationship" defined in a plan view.

A vertical movement actuator M2 is supported by the vertical movement actuator 35. The vertical movement actuator M2 includes a vertically moving motor, and a vertically moving drum which is drivingly rotated by the vertically moving motor. The ends of the wires 19a which are spooled or fed out by the vertically moving drum are connected to the grip portion 30. The grip portion 30 is suspended from and supported by the vertical movement actuator 35 by the wires 19a. The grip portion 30 is raised or lowered by causing the vertically moving motor to rotate in a forward direction or in a reverse direction.

Figure 2:
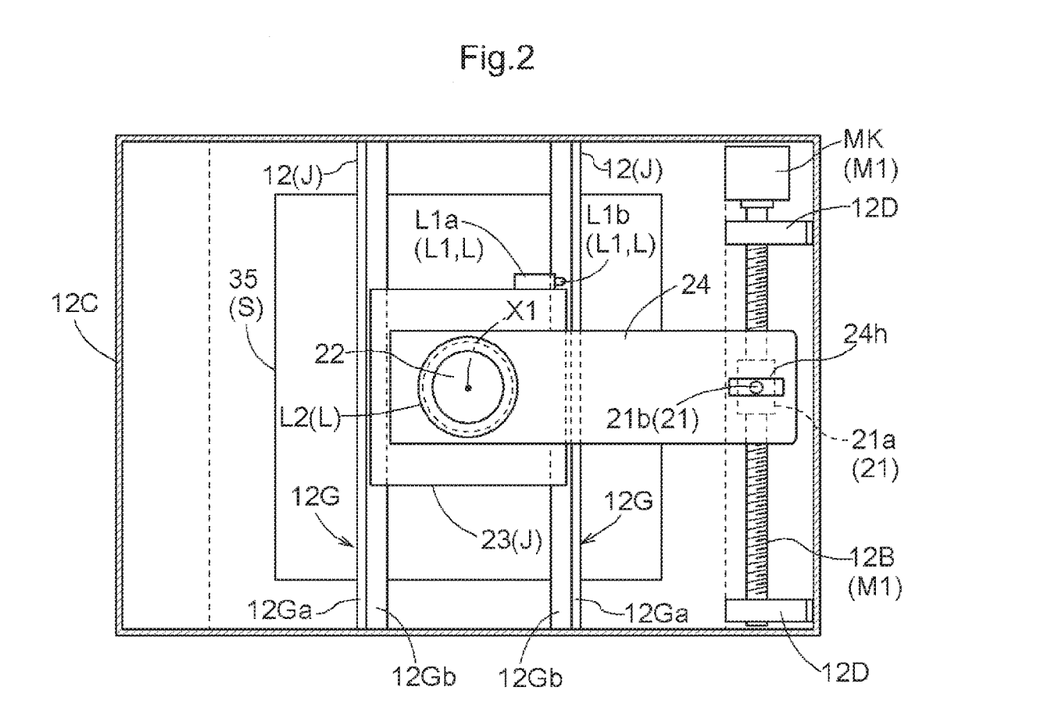
FIG. 2 shows the entire structure of a linearly moving and rotating device.
Figure 3:
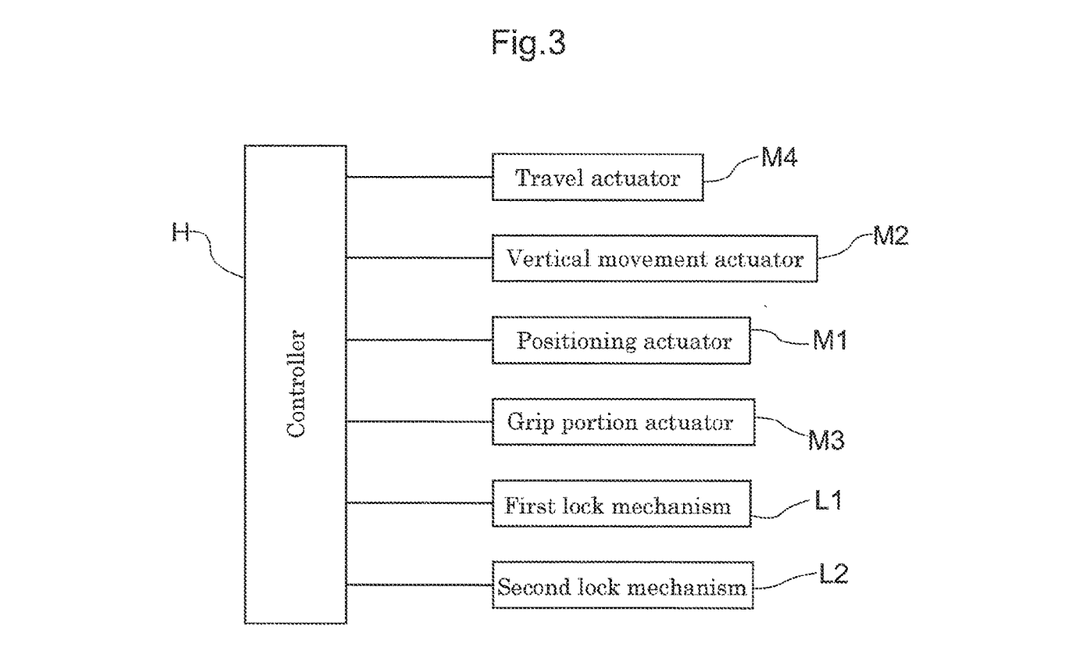
FIG. 3 is a control block diagram.

The linearly moving and rotating device of the present embodiment is described next with reference to FIGS. 1-3. The support plate 12S has a slit that extends perpendicular to the travel direction of the travel portion 11 in plan view. In addition, the guide rails 12G for guiding the linear movement of the support body 23 is provided to the support plate 12S and along the opening edges of the slit. The linear movement support member 23 is formed in a rectangular shape as shown in FIG. 2 or FIG. 3. The sides, of the linear movement support member 23, that are positioned opposite from each other along the travel direction of the travel portion 11 in plan view are in contact with upright portions 12Ga of the guide rails 12G. This allows the linear movement support member 23 to move while maintaining its orientation with respect to the guide rails 12G in plan view. In addition, the bottom face portions of the linear movement support member 23 are configured to have low friction against the top surfaces of horizontal portions of the guide rails 12G. In the present embodiment, the bottom face portions of the linear movement support member 23 are structured to support bearing balls. However, for example, the bottom face portions of the linear movement support member 23 may be formed of material with a small coefficient of friction. In the present embodiment, the direction in which the guide rails 12G guide the linear movement support member 23 is, or corresponds to, the first direction D1.

In addition, a first lock mechanism L1 including a main body portion L1a and a lock pin L1b is attached to the linear movement support member 23. The first lock mechanism L1 can be placed in a locking state for restricting movement of the linear movement support member 23 relative to the guide rail 12G, by projecting the lock pin L1b to cause it to contact the upright portion 12Ga of the guide rail 12G. In addition, the first lock mechanism L1 can be placed in a release state for allowing movement of the linear movement support member 23 relative to the guide rail 12G, by retracting the lock pin L1b to cause it to move away from the upright portion 12Ga of the guide rail 12G.

In addition, the linear movement support member 23 pivotably supports a pivot shaft portion 22 at an approximate center of the linear movement support member 23 in plan view. The vertical movement actuator 35 is fixed to the lower end of the pivot shaft portion 22. Therefore, the vertical movement actuator 35 is supported for rotation relative to the linear movement support member 23, about the pivot shaft portion 22 as the axis of rotation.

In one end portion of the support plate 12S along the travel direction of the travel portion 11, a screw shaft 12B is rotatably supported by a screw shaft support bodies 12D such that its pivot axis extends along the guide rail 12G (that is, a direction along the first direction D1). In addition, a rotation motor MK for drivingly rotating the screw shaft 12B is provided on the support plate 12S. Further, the screw shaft 12B is provided with a block 21a which has internal thread that meshes with the screw shaft 12B and which is movable along the screw shaft 12B as the screw shaft 12B is rotated. Therefore, the block 21a is attached to the screw shaft 12B such that it can move along the first direction D1 as the screw shaft 12B is rotated. The block 21a has an engaging pin 21b located above it for engaging a long hole 24h of the connecting member 24 described below.

The connecting member 24 is connected to the pivot shaft portion 22 so as to rotate integrally therewith so that the connecting member 24 can rotate about the pivot shaft portion 22 as the center of rotation in plan view. In addition, between the connecting member 24 and the pivot shaft portion 22, a second lock mechanism L2 of an electromagnetic brake type is provided which can be switched between a release state for allowing relative rotation between them, and a locking state for restricting the relative rotation.

In the present embodiment, the axis X1 of the pivot shaft portion 22 is, or corresponds to, the movable axis: the connecting member 24 is, or corresponds to, an operated member: the block 21a is, or corresponds to the linearly movable member: the guide rails 12G and the linear movement support member 23 are, or correspond to, the support portion: and, the positioning actuator M1 consisting of the rotation motor MK and the screw shaft 12B is, or corresponds to the actuator. That is, the linearly moving and rotating device includes the connecting member 24 integrally provided with the article support portion S, the guide rails 12G and the linear movement support member 23 which support the connecting member 24 for rotation about the axis X1 of the pivot shaft portion 22 and which support the connecting member 24 for movement along the first direction D1, and the block 21a which is moved by the rotation motor MK and the screw shaft 12B along the first direction D1. The connecting member 24 is connected to the block 21a in its portion that is spaced apart from the axis X1 of the pivot shaft portion 22 as seen along the axis X1 of the pivot shaft portion 22.

The control related configuration in the present embodiment is described next. The controller H for controlling operation of each part of the ceiling transport vehicle 1 is provided to the ceiling transport vehicle 1. The controller H includes a microcomputer as its core component, which includes, for example, memory, an register, arithmetic unit, etc. And the controller H stores control programs in its memory and loads the programs to the arithmetic unit for execution. In addition, connected to the controller H for communication are the positioning actuator M1, the vertical movement actuator M2, the grip portion actuator M3, the travel actuator M4, the first lock mechanism L1, and the second lock mechanism L2. And the controller H controls operation of each of them.

Note that, while not shown, a superordinate managing device which issues transport commands to the ceiling transport vehicle is provided for mutual communication with the controller H. The controller H receives the transport command from the superordinate managing device, and performs various controls (travel control, vertical movement control, gripping state switching control, etc.) in accordance with the transport command. Here, the travel control is a control for operating the travel actuator M4 to move the travel portion 11 to a travel position that corresponds to the target station. In addition, the vertical movement control is a control for operating the vertical movement actuator M2 to vertically move the grip portion 30 at the travel position. In addition, the gripping state switching control is a control for operating the grip portion actuator M3 to cause the gripping oscillation members 31 of the grip portion 30 to be spaced apart from, or located closer to each other to change or switch the gripping state of the flange Bf of the container B.

Figure 4:
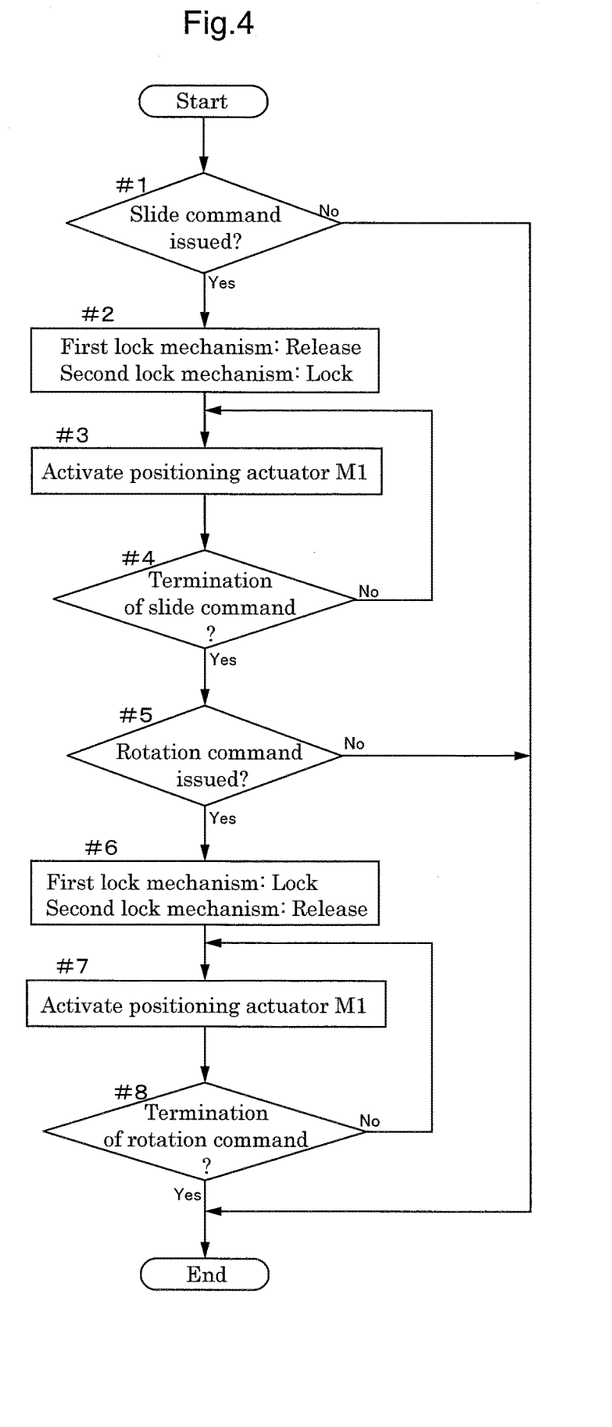
FIG. 4 is a flow chart for explaining a linear movement actuation control and a rotation control.
Figure 5:
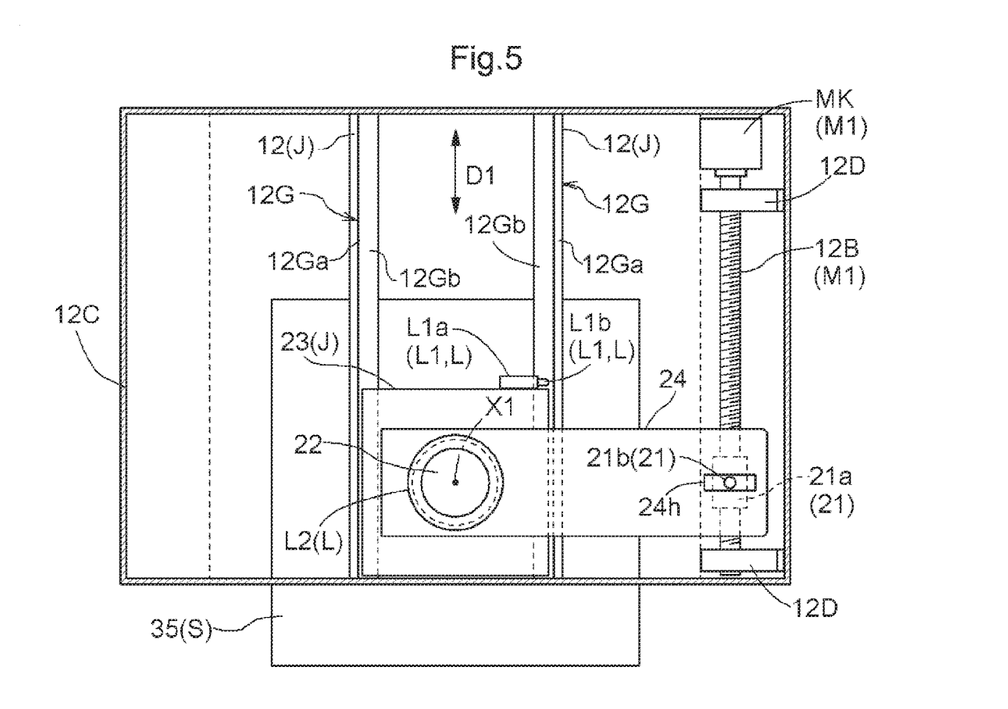
FIG. 5 is a plan view for explaining the linear movement actuation control.

As shown in the flowchart of FIG. 4, if and when the controller H receives from a superordinate managing device a slide command which commands it to slide the article support portion S along the first direction D1 (Step #1), the controller H performs the following control. The controller H performs a control to place the first lock mechanism L1 in the release state, and to place the second lock mechanism L2 in the locking state (Step #2). In other words, the controller H controls the operations of the first lock mechanism L1 and the second lock mechanism L2 to restrict rotation of the pivot shaft portion 22 of the connecting member 24 about the axis X1 by placing the second lock mechanism L2 in the locking state, and to allow movement of the connecting member 24 along the first direction D1 by placing the first lock mechanism L1 in the release state. And in that state, the positioning actuator M1 is activated to rotate the screw shaft 12B (Step #3) until termination of the slide is commanded (Step #4: Yes). As shown in FIG. 5, this causes the connecting member 24 to move while maintaining its rotational orientation about the axis X1 of the pivot shaft portion 22 in plan view, as the block 21a is moved, so that the linear movement support member 23 is moved along the first direction D1. Thus, the pivot shaft portion 22 supported by the linear movement support member 23 and the article support portion S supported by the lower end of the pivot shaft portion 22 can be moved along the first direction D1 while maintaining the rotational orientation of the article support portion S about the axis X1 of the pivot shaft portion 22. In the present embodiment, the control in accordance with Step #2 and Step #3 is, or corresponds to, the linear movement actuation control.

Figure 6:
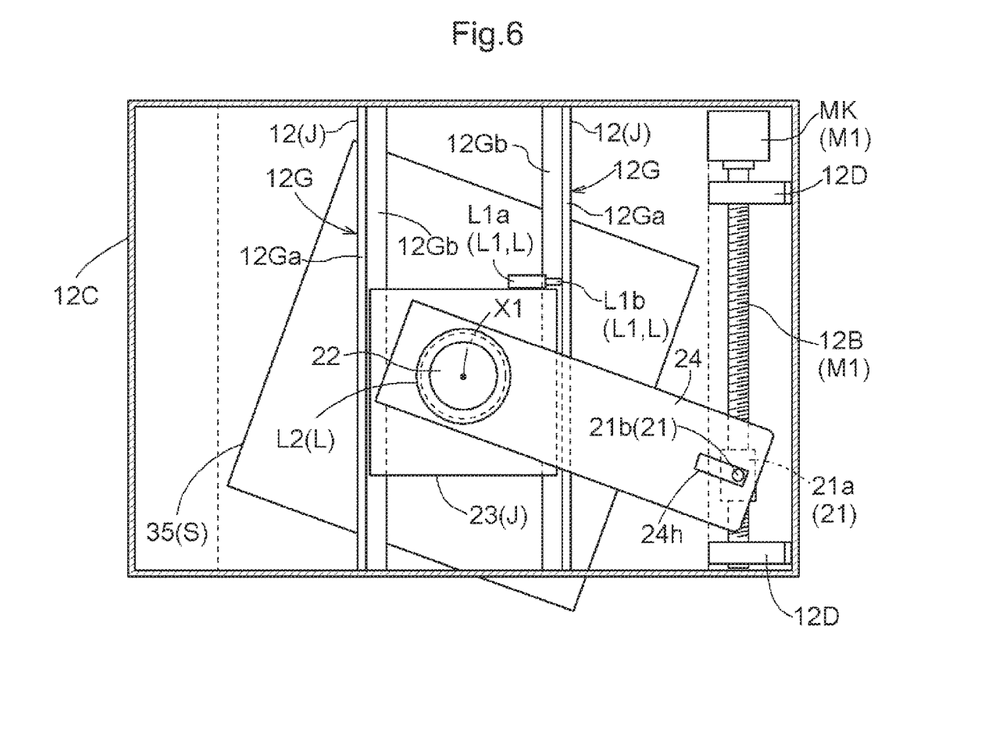
FIG. 6 is a plan view for explaining the rotation control.

In addition, if and when the controller H receives from the superordinate managing device a rotation command for causing the article support portion S to be rotated about the axis X1 of the pivot shaft portion 22 (Step #5), the controller H performs the following control. The controller H performs a control to place the second lock mechanism L2 in the release state, and to place the first lock mechanism L1 in the locking state (Step #6). In other words, the controller H controls the operations of the first lock mechanism L1 and the second lock mechanism L2 to allow rotation of the pivot shaft portion 22 of the connecting member 24 about the axis X1 of the pivot shaft portion 22 by placing the second lock mechanism L2 in the release state, and to restrict movement of the connecting member 24 along the first direction D1 by placing the first lock mechanism L1 in the locking state. And in that state, the positioning actuator M1 is operated to rotate the screw shaft 12B (Step #7) until termination of the rotation is commanded (Step #4: Yes). As shown in FIG. 6, this causes the connecting member 24 to be rotated about the axis X1 of the pivot shaft portion 22 while maintaining its position along the first direction D1 as the block 21a is moved. Because the connecting member 24 and the pivot shaft portion 22 are connected to each other to rotate integrally, the pivot shaft portion 22 is also rotated about its axis X1 as the center of rotation. In addition, as shown in FIG. 1, because the vertical movement actuator 35 which is a part of the article support portion S is fixed to the lower end of the pivot shaft portion 22, the vertical movement actuator 35 (article support portion 5) is also similarly rotated. Therefore, the connecting member 24 can be rotated about the axis X1 of the pivot shaft portion 22 while maintaining the position of the linear movement support member 23 along the first direction D1. In the present embodiment, the control in accordance with Step #6 and Step #7 is, or corresponds to, the rotation control.

Note that, in the present embodiment, the first lock mechanism L1 and the second lock mechanism L2 are, or correspond to, the operating state switching portion L. In addition, "the state in which the second lock mechanism L2 is in the locking state, and in which the first lock mechanism L1 is in the release state" is, or corresponds to the linearly moving state. In addition, "the state in which the second lock mechanism L2 is in the release state, and in which the first lock mechanism L1 is in the locking state" is, or corresponds to the rotating state. And the controller H can cause the shift or switch between the linearly moving state and the rotating state by controlling the operations of the first lock mechanism L1 and the second lock mechanism L2.

In addition, the controller H is configured to perform the linear movement actuation control and the rotation control, as described above. Here, the "linear movement actuation control" is a "control for causing the article support portion S to be moved along the first direction D1 by placing the first lock mechanism L1 and the second lock mechanism L2 in the linearly moving state and by activating the positioning actuator M1 to rotate the screw shaft 12B". In addition, the "rotation control" is a "control for causing the article support portion S to be rotated about the axis X1 of the pivot shaft portion 22 by placing the first lock mechanism L1 and the second lock mechanism L2 in the rotating state, and by activating the positioning actuator M1 to rotate the screw shaft 12B".

The control for transporting a container B using the ceiling transport vehicle of the present embodiment is described next. In the present embodiment, while not shown, stations for delivering and receiving a container B supported by the article support portion S (more specifically, by the grip portion 30) are provided at locations along the travel rails 2 in plan view and below the article support portion S.

The controller H picks up a container B at a station of transport origin, and unloads it at a station of transport destination, based on a transport command from the superordinate managing device. To do so, the controller H causes the travel portion 11 to travel to a travel position that corresponds to the station of transport origin, or the station of transport destination, and causes the pick up or unloading to be performed, with the travel portion 11 stopped at the travel position. In the description below, descriptions are omitted regarding the traveling of the travel portion 11 to the location corresponding to the station of transport origin, and traveling of the travel portion 11 from the location corresponding to the station of transport origin to the location corresponding to the station of transport destination. In what follows, a station of transport origin or a station of transport destination will be the station to or from which a container B is transferred. And the description will be centered on the transfer operation at the transfer target station.

The orientation of the container B in plan view when supporting it is specified for the station (and will be referred to as the specified transfer orientation). However, when lowering the grip portion 30 in order to pick up a container B supported by the station, the positional relationship between the location of the flange Bf of the container B supported by the station and that of the gripping oscillation members 31 of the grip portion 30 may not be the "set engaging positional relationship" described above. In addition, conversely, when the grip portion 30 is lowered in order to unload a container B onto the station, the orientation of the container B in plan view may not be the "specified transfer orientation" for the station. At the time of a pick up, the controller H performs the linear movement actuation control and the rotation control to bring the positional relationship between the location of the flange Bf of the container B supported by the station and that of the gripping oscillation members 31 of the grip portion 30 to be the set engaging positional relationship. Or, at the time of unloading, the controller H performs the linear movement actuation control and the rotation control to bring the orientation of the container B in plan view to be the specified transfer orientation for the station.

The controller H has stored in memory, for each station, the amounts of movements necessary to satisfy the set engaging positional relationship at the time of a pick up as well as the amounts of movements necessary to satisfy the specified transfer orientation at the time of unloading. The former amounts of movements are the amounts of movements necessary to bring the positional relationship between the location of the flange Bf of the container B supported by the station and that of the gripping oscillation member 31 of the grip portion 30 to be the set engaging positional relationship, at the time of the pick up. In other words, these amounts of movements are "an amount of linear movement by which the article support portion S is moved along the first direction D1" and "an amount of rotational movement by which the article support portion S is rotated about the axis X1 of the pivot shaft portion 22". In addition, the latter amounts of movements are amounts of movements necessary to bring the orientation of the container B in plan view to be the specified transfer orientation for the station, at the time of unloading. In other words, these amounts of movements are "an amount of linear movement by which the article support portion S is moved along the first direction D1" and "an amount of rotational movement by which the article support portion S is rotated about the axis X1 of the pivot shaft portion 22".

Note that the "amounts of movements amount at the time of a pick up" and the "amounts of movements at the time of unloading" are equal to each other. Therefore, the controller H only needs to have stored in memory, for each station, a single (same) amounts of movements (the amount of linear movement by which the article support portion S is moved along the first direction D1 and the amount of rotational movement by which the article support portion S is rotated about the axis X1 of the pivot shaft portion 22).

Figure 7:
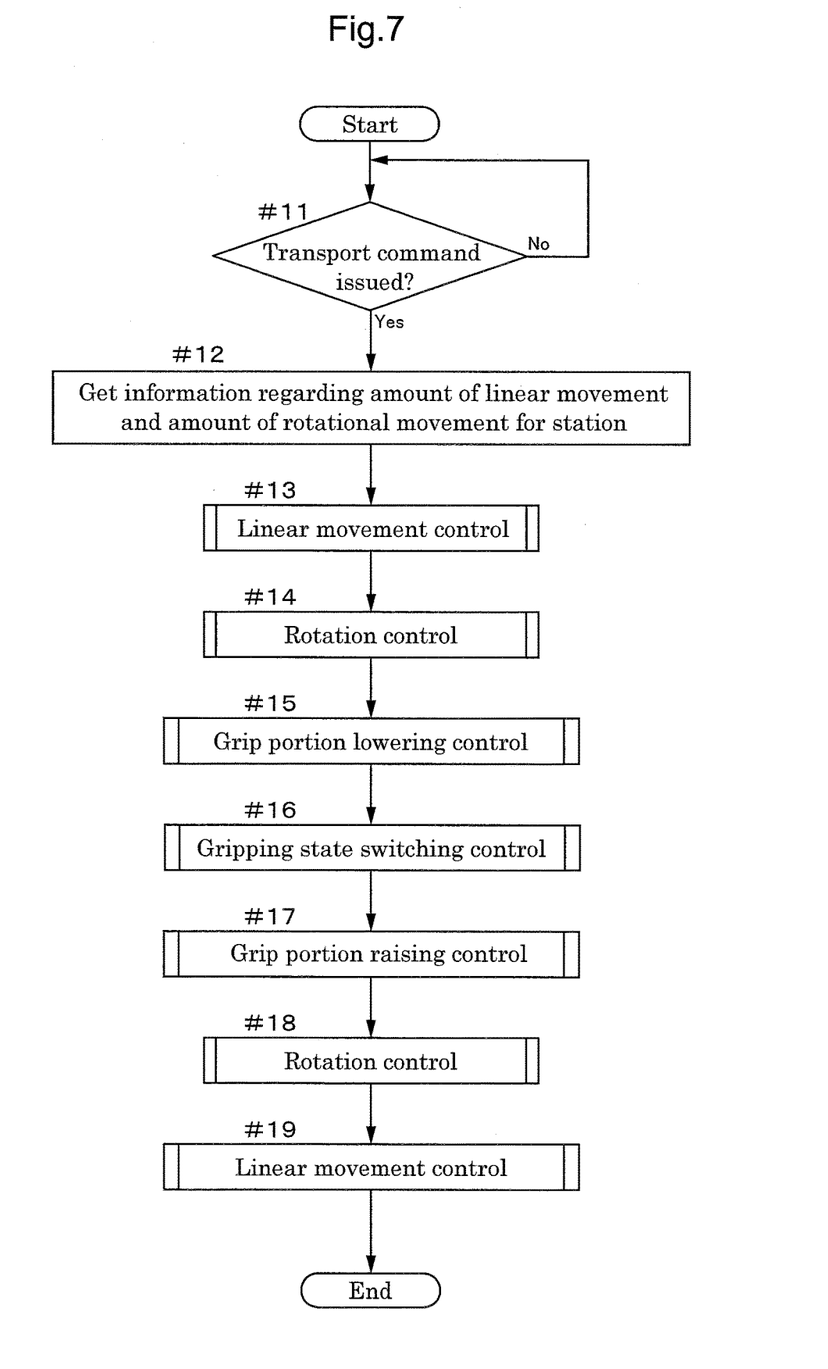
FIG. 7 is a flow chart for explaining positioning of an article support portion when a transport command is issued.

As shown in the flowchart of FIG. 7, when the controller H receives a transport command from the superordinate managing device (Step #11), the controller H obtains information stored in the controller H regarding the amount of linear movement and the amount of rotational movement for the station (Step #12). And the controller H performs the linear movement actuation control described above based on the obtained amount of linear movement (Step #13), and performs the rotation control described above based on the obtained amount of rotational movement (Step #14). Subsequently, the controller H activates the vertical movement actuator M2 to lower the grip portion 30 (Step #15), and performs the gripping state switching control (Step #16). At this time, the positional relationship between the location of the flange Bf of the container B supported by the station and that of the gripping oscillation members 31 of the grip portion 30 has been brought to be the set engaging positional relationship by the linear movement actuation control and the rotation control. Or the orientation of the container B in plan view has been brought to be the specified transfer orientation for the station. Therefore, the transfer of the container B at the station is performed properly.

Subsequently, the controller H actuates the vertical movement actuator M2 to raise the grip portion 30 (Step #17). And the controller H, based on the amount of rotational movement obtained in Step #12, performs the rotation control to rotate the article support portion S in the opposite direction by the same amount of rotation as the amount of rotation by which the article support portion S was rotated about the axis X1 of the pivot shaft portion 22 in Step #14 (Step #18). Further, the controller H, based on the amount of linear movement obtained in Step #12, performs the linear movement actuation control to move the article support portion S in the opposite direction by the same amount of movement as the amount of movement by which the article support portion S was moved along the first direction D1 in Step #13 (Step #19). This allows the article support portion S to be returned to the set transporting position which corresponds to a position at which a container B should be positioned in plan view when transporting the container B.

ALTERNATIVE EMBODIMENTS (1) In the description above, an example is illustrated in which the actuator includes the screw shaft 12B and the rotation motor MK for rotating it, and in which the linearly movable member is the block 21a which meshes with the screw shaft 12B and which is moved by the rotation of the screw shaft 12B. However, the actuator and the linearly movable member are not limited to such arrangement. For example, the arrangement may be one in which a linearly movable member which can be moved along a linear guide is moved along the first direction D1 by means of a crank mechanism. In this case, the crank mechanism serves as the actuator. In addition, the arrangement may be one in which a linearly movable member is moved along the first direction D1 by means of a chain which can circulate and actuate along the first direction D1. In this case, the chain serves as the actuator. In addition, a rack gear, or a chain, etc. may be laid on the support plate 12S and along the first direction D1. And a linearly movable member may be provided with a pinion gear which is in toothed engagement with the rack gear or the chain, and with a motor which drivingly rotates the pinion gear. In this case, the actuator is provided to the linearly movable member.

Figure 8:
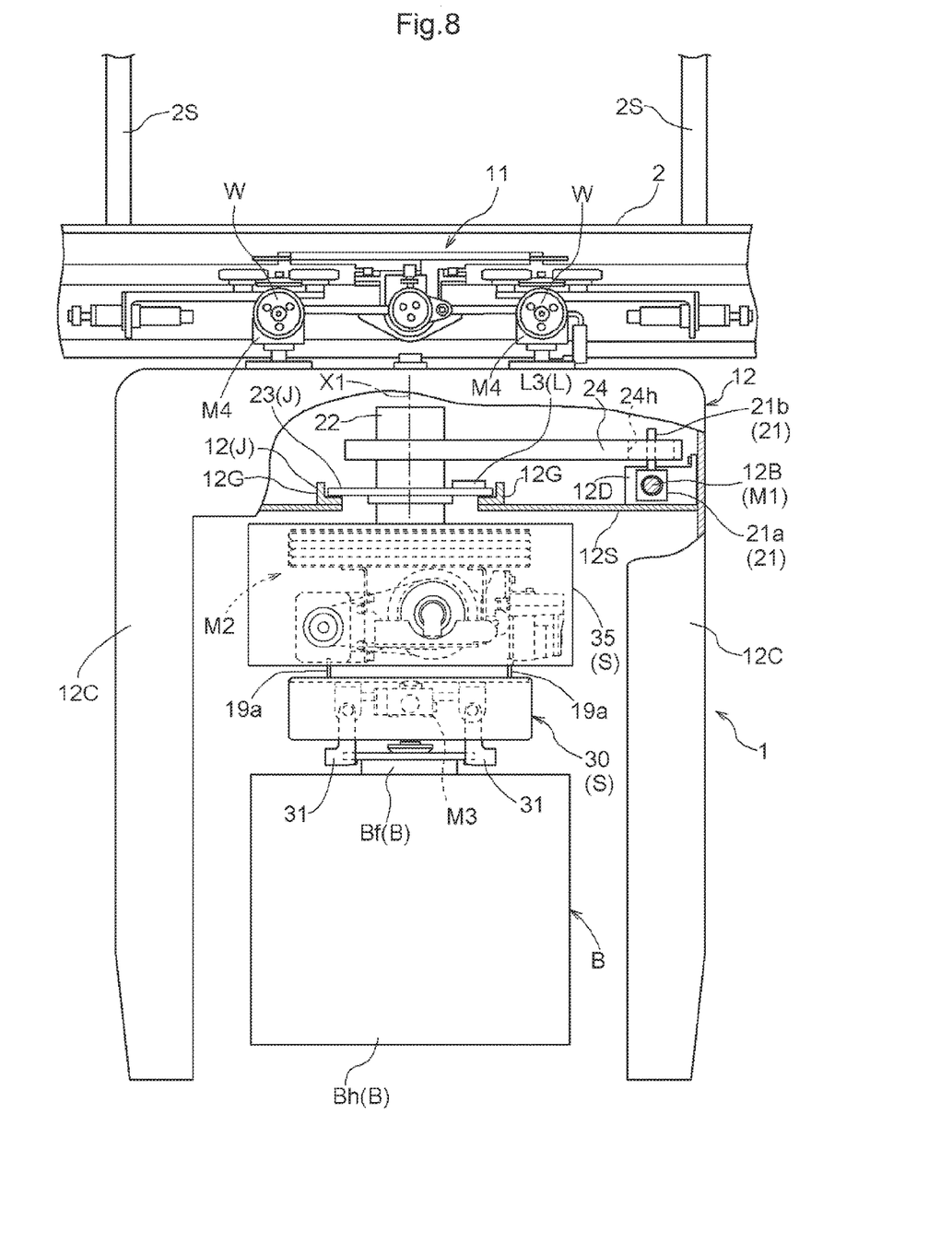
FIG. 8 is a partially cutaway side view of a ceiling transport vehicle in accordance with an alternative embodiment.
Figure 9:
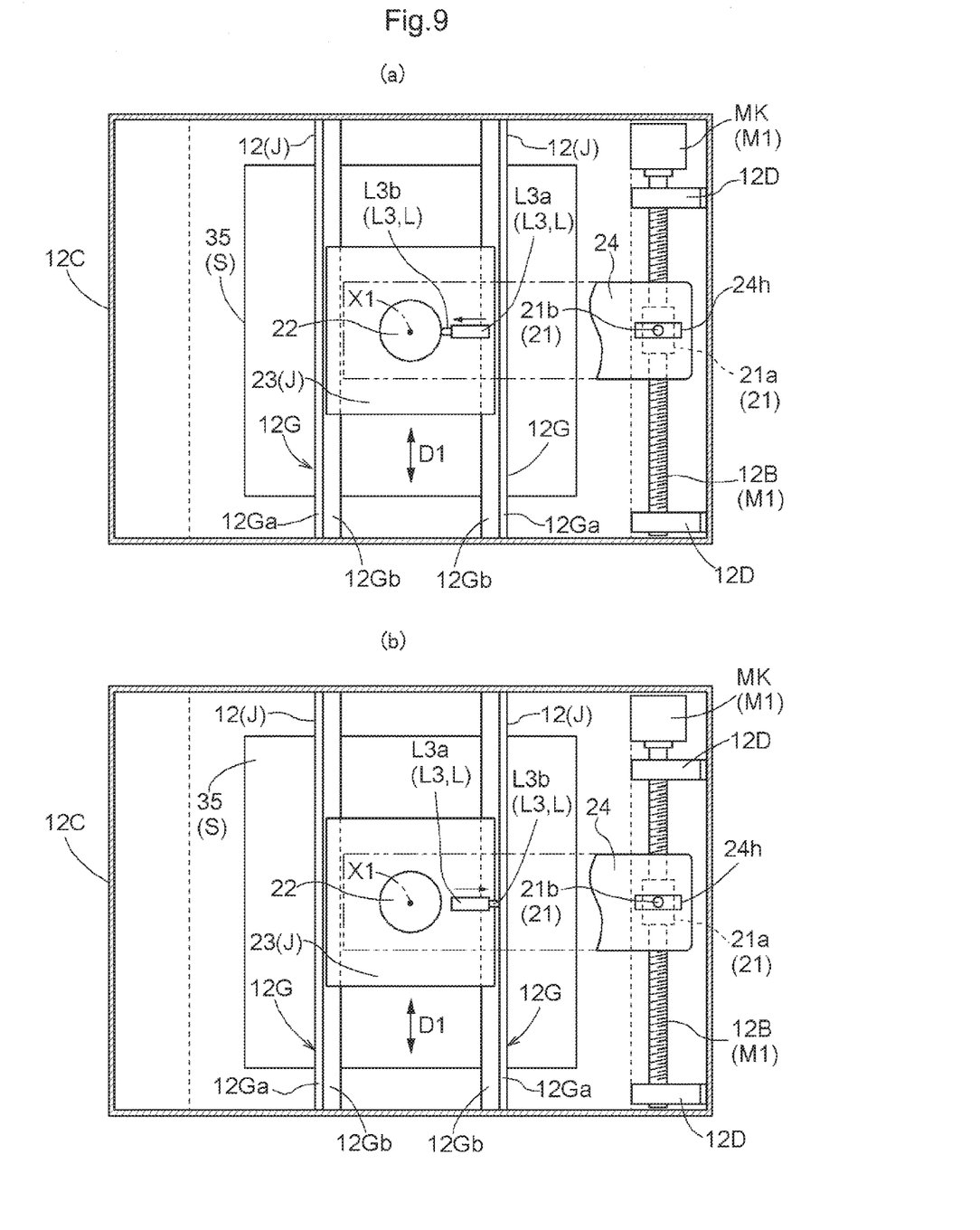
FIG. 9 is a plan view for explaining a linear movement actuation control and a rotation control in an alternative embodiment.

(2) In the description above, an example is illustrated in which the operating state switching portion L consists of two lock mechanisms, namely the first lock mechanism L1 and the second lock mechanism L2. However, the operating state switching portion L is not limited to such arrangement. For example, as shown in FIGS. 8-10, the operating state switching portion L may consist of a single lock mechanism L3. The lock mechanism L3 includes a main body portion L3a and a lock pin L3b, and the main body portion L3a is fixed to the linear movement support member 23. The main body portion L3a is disposed between the pivot shaft portion 22 and the upright portion 12Ga of the guide rail 12G, of the linear movement support member 23. The lock pin L3b can be switched or changed to a state in which it projects toward the pivot shaft portion 22 and to a state in which it projects toward the upright portion 12Ga of the guide rail 12G.

When the lock pin L3b is projected toward the pivot shaft portion 22, the lock pin L3b comes into contact with the pivot shaft portion 22 as shown in FIG. 9(a), so that the pivot shaft portion 22 is fixed and cannot rotate relative to the linear movement support member 23. Therefore, this restricts the rotation, about the axis X1 of the pivot shaft portion 22, of the connecting member 24 which is attached to the pivot shaft portion 22 for integral rotation therewith. In addition, since the lock pin L3b is spaced apart from the upright portion 12Ga of the guide rail 12G at this time, movement of the connecting member 24 along the first direction D1 is allowed. Thus, a linearly moving state is thus achieved.

Further, when the lock pin L3b is projected toward the upright portion 12Ga of the guide rail 12G, the lock pin L3b comes into contact with the upright portion 12Ga of the guide rail 12G as shown in FIG. 9(b) so that movement of the linear movement support member 23 along the first direction D1 is restricted. In addition, since the lock pin L3b is spaced apart from the pivot shaft portion 22 at this time, the pivot shaft portion 22 can be rotated relative to the linear movement support member 23. Therefore, this allows the rotation, about the axis X1 of the pivot shaft portion 22, of the connecting member 24 which is attached to the pivot shaft portion 22 for integral rotation therewith. Thus, a rotating state is thus achieved.

(3) In the description above, an arrangement is described in which the linearly moving and rotating device is used to adjust the orientation of the grip portion of the ceiling transport vehicle 1 in plan view. However, the linearly moving and rotating device of the present invention can be applied not only to a ceiling transport vehicle 1 but also to various apparatus that are required to achieve a linearly moving state and a rotating state. In addition, in the above description, a case is described in which the article support portion supports a container B to transport it, treating the container B holding semi-conductor substrates as an article. However, the article support portion may be used, for example, to support a tool, or a jig, etc. In addition, the container B, a tool, or a jig does not have to be one that is gripped by a grip portion as described in the aforementioned embodiment described, and may instead be one that is fixedly attached to the article support portion.

(4) In the description above, an arrangement is described in which, when a transport command is received from a superordinate managing device, a linear movement actuation control and a rotation control are performed after lowering the grip portion 30, and the grip portion 30 is raised after performing a linear movement actuation control and a rotation control. However, the order of lowering or raising of the grip portion 30, and the linear movement actuation control and rotation control may be reversed. In addition, either of the linear movement actuation control and rotation control may be performed first.

(5) In the description above, an example is described in which the linearly moving and rotating device includes the movable axis that extends perpendicular to the first direction D1 (that is, along the vertical direction) in plan view (movable axis: axis X1 of the pivot shaft portion 22). However, the direction along which a movable axis extends is not limited to this. That is, a movable axis may extend perpendicular to the first direction D1 (that is, along a horizontal direction) as seen along a horizontal direction, or may be tilted from a horizontal or a vertical direction.

DESCRIPTION OF REFERENCE NUMERALS AND SYMBOLS

12B Screw shaft
12G Guide rail (Support portion)
21a Block (Linearly movable member)
23 Linear movement support member (Support portion)
24 Connecting member (Operated member)
S Article support portion
B Article
D1 First direction
H Controller
J Support portion
L Operating state switching portion
MK Rotation motor
M1 Positioning actuator (Actuator)
X1 Axis of pivot shaft portion (Movable axis)

The invention claimed is:

1. A linearly moving and rotating device for moving an article support portion for supporting an article along a straight first direction and for rotating the article support portion about a movable axis extending perpendicular to the first direction, the linearly moving and rotating device comprises:
an operated link which is integrally provided with the article support portion;
a guide support portion that supports the operated link for rotation about the movable axis and that supports the operated link for movement along the first direction;
a pivot shaft portion rotatably connecting the operated link of the article support portion to the guide support portion, the pivot shaft portion has the movable axis;
a linearly movable block which is moved along the first direction by an actuator, wherein the operated link is connected to the linearly movable block in a portion spaced apart from the movable axis and the pivot shaft portion as seen along a direction along the movable axis;
a first lock mechanism mounted to the guide support portion engageable for restricting movement of the operated link along the straight first direction at any location of the operated link; and
a second lock mechanism mounted between the pivot shaft portion and the operated link engageable for restricting rotation of the operated link about the movable axis;
wherein disengagement of the first lock mechanism and engagement of the second lock mechanism defines a linearly moving state for restricting rotation of the operated link about the movable axis and for allowing movement of the operated link along the first direction;
wherein engagement of the first lock mechanism and disengagement of the second lock mechanism defines a rotating state for allowing rotation of the operated link about the movable axis and for restricting movement of the operated link along the first direction;
wherein the first lock mechanism comprises an extendable and retractable locking pin, and
wherein the second lock mechanism comprises an electromagnetic brake.

2. The linearly moving and rotating device as defined in claim 1, wherein the actuator includes a screw shaft arranged such that a pivot axis thereof extends along the first direction, and a rotation motor for drivingly rotating the screw shaft about the pivot axis, and
wherein the linearly movable block is attached to the screw shaft so as to move along the first direction as the screw shaft is rotated.

3. The linearly moving and rotating device as defined in claim 1, further comprising:
a controller for controlling operations of the actuator and the operating state switching portion, and wherein the controller performs a linear movement actuation control for causing the article support portion to be moved along the first direction by placing the operating state switching portion in the linearly moving state and activating the actuator, and a rotation control for causing the article support portion to be rotated about the movable axis by placing the operating state switching portion in the rotating state and activating the actuator.

* * * * *